United States Patent [19]
Simon

[11] 3,912,852
[45] Oct. 14, 1975

[54] THIN-FILM ELECTRICAL CIRCUIT LEAD CONNECTION ARRANGEMENT

[75] Inventor: Alan J. Simon, Level Green, Pa.

[73] Assignee: Westinghouse Electric Corporation, Pittsburgh, Pa.

[22] Filed: May 31, 1974

[21] Appl. No.: 475,237

[52] U.S. Cl. ........... 174/68.5; 29/626; 317/101 CC; 339/17 C
[51] Int. Cl.$^2$ .......................................... H05K 1/04
[58] Field of Search ............ 174/68.5, 52 R, DIG. 3; 317/101 R, 101 CC, 101 CM, 101 D; 29/626; 339/17 C

[56] References Cited

UNITED STATES PATENTS

| | | | |
|---|---|---|---|
| 3,474,297 | 10/1969 | Bylander | 317/101 CC UX |
| 3,662,230 | 5/1972 | Redwantz | 174/DIG. 3 UX |
| 3,683,105 | 8/1972 | Shamash et al. | 317/101 CC X |

*Primary Examiner*—Darrell L. Clay
*Attorney, Agent, or Firm*—R. W. Smith

[57] ABSTRACT

An arrangement is disclosed for connecting leads to thin-film electrical circuits. An insulating sheet having conductive strips disposed thereon is placed over the thin-film circuit. A conductive bonding material extends through openings in both the insulating sheet and the conductive strips to electrically connect one end of each conductive strip to the thin-film circuit. The other end of each conductive strip extends beyond the electrical circuit for connection to another lead or a terminal pin.

6 Claims, 3 Drawing Figures

THIN-FILM ELECTRICAL CIRCUIT LEAD CONNECTION ARRANGEMENT

BACKGROUND OF THE INVENTION

1. Field of the Invention

This invention relates, in general, to thin-film electrical circuits and, more specifically, to arrangements for connecting electrical leads to thin-film electrical circuits.

2. Description of the Prior Art

Thin-film electrical circuits, which consist of layers of insulating, conducting, and semiconducting materials, are constructed by suitably depositing these materials onto a substrate. When the substrate consists of an insulating material, leads interconnecting the thin-film circuit to terminal pins or to other circuits are not susceptible to shorting if they come into contact with the substrate. However, when the substrate consist of a suitably passivated conductive material, such as anodized aluminum foil, there exist the possibility of shorting the leads together if the leads contact the exposed metal edge of the foil.

Several thin-film circuits are deposited on a single sheet of passivated conducting substrate material in one method of fabricating thin-film circuits. The circuits are separated by cutting the substrate material to separately provide each individual thin-film circuit. Because of the cutting operation, the exposed edges of the substrate are not insulated. Any non-insulated leads which come into contact with an exposed edge of the substrate are short circuited together. Thus, it is necessary, when using conductive substrates, to suitably insulate the substrate edges from the leads which connect to the thin-film electrical circuit.

The leads which connect to the thin-film circuit usually connect the circuit to external pins or terminals contained in a package which houses the thin-film circuit. In some applications, the leads may be directly connected to other thin-film circuits or to more conventional electrical circuit components. Whatever the termination of the leads, there must be some means for attaching the leads to the thin-film circuit without the possbility of shorting the leads together at uninsulated edges of the conductive substrate. Therefore, it is desirable, and it is an object of this invention, to provide an arrangement which conveniently, economically, and reliably connects leads to thin-film electrical circuits without the possibility of lead shorting due to contact with a conductive substrate.

SUMMARY OF THE INVENTION

There is disclosed herein a new and useful arrangement for connecting leads to thin-film electrical circuits. The thin-film circuit is disposed on a conductive substrate having an insulated coating or surface. An insulating sheet with interconnecting conductive lead strips deposited thereon is positioned on top of the thin-film circuit. The lead strips are electrically connected to circuit connection points formed by lands of the thin-film circuit by a conductive bonding material which extends through openings in the insulating sheet so as to contact lands and the lead strips. The lead strips extend beyond the adjacent edge of the conductive substrate for connection to other electrical conductors. Because of the location of the insulating sheet between the lead strip and the edge of the conductive substrate, the lead strip cannot be shorted by contact with the uninsulated part of the substrate. In one embodiment, terminal pins extend through openings located at the outer ends of the lead strips and are electrically connected to the lead strips by a conductive bonding material.

BRIEF DESCRIPTION OF THE DRAWING

Further advantages and uses of this invention will become more apparent when considered in view of the following detailed description and drawing, in which.

DESCRIPTION OF THE PREFERRED EMBODIMENT

Figures 1, 3:
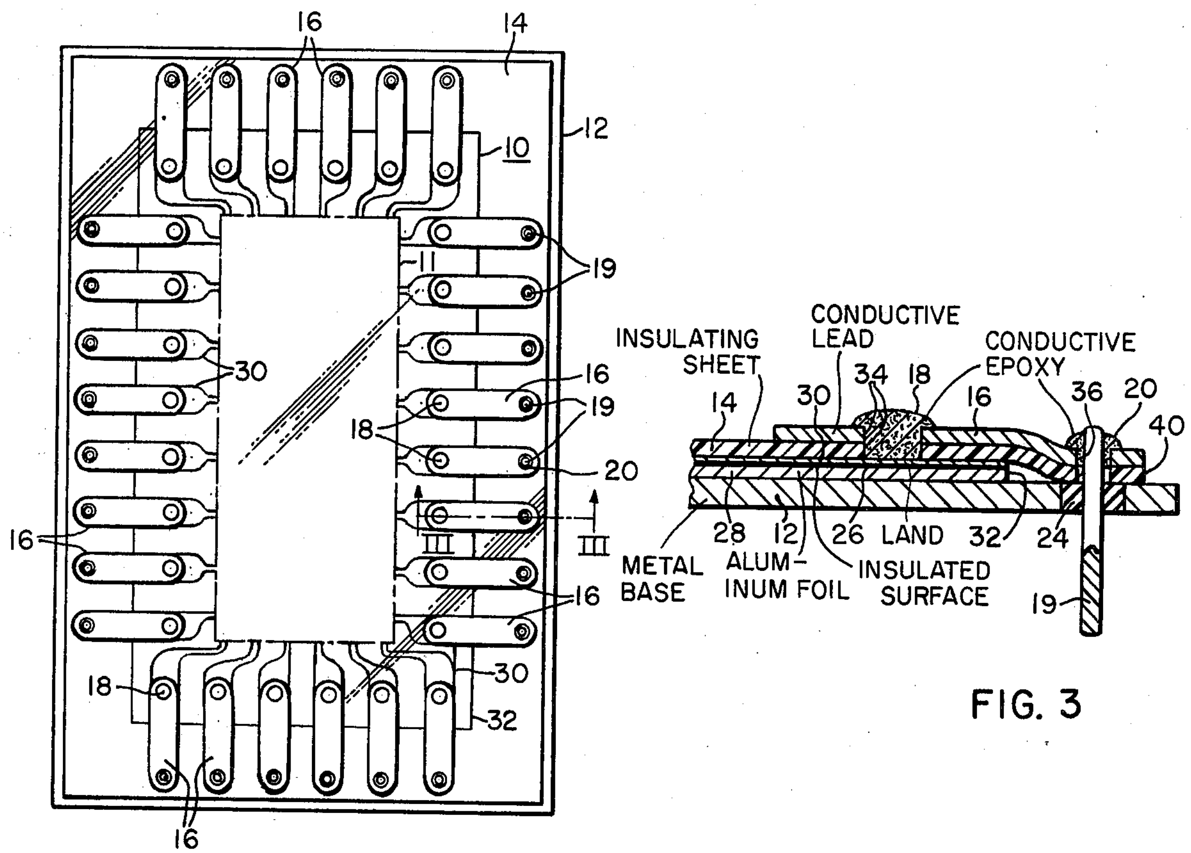
FIG. 1 is a plan view of a thin-film circuit assembly package constructed according to this invention.

Throughout the following description, similar reference characters refer to similar elements or members in all of the figures of the drawing.

Referring now to the drawing, and to FIG. 1 in particular, there is shown a thin-film electrical circuit assembly 10 including a thin-film circuit 11 carried in a substantially rectangular open package by a flat support base 12. It is emphasized that various package configurations including can enclosures or covers having an open end attached to the base 12, plastic encapsulation of the circuit assembly 10, and other packaging arrangements may be used without departing from the scope of the invention. The thin-film circuit assembly 10 includes an insulating sheet 14 overlaying the circuit 11 which has a plurality of interconnecting lead strips 16 disposed on the sheet 14. The lead strips 16 are attached to the thin-film circuit 11 near their inner ends by a conductive bonding material, such as the conductive material 18 indicated near the inner end of each of the lead strips 16. The lead strips are attached, in the specific embodiment shown in FIG. 1, near their outer ends to terminal pins 19 in the base 12 by a bonding conductive material, such as the conductive material 20 illustrated near the outer end of the lead strip 16.

Figure 2:
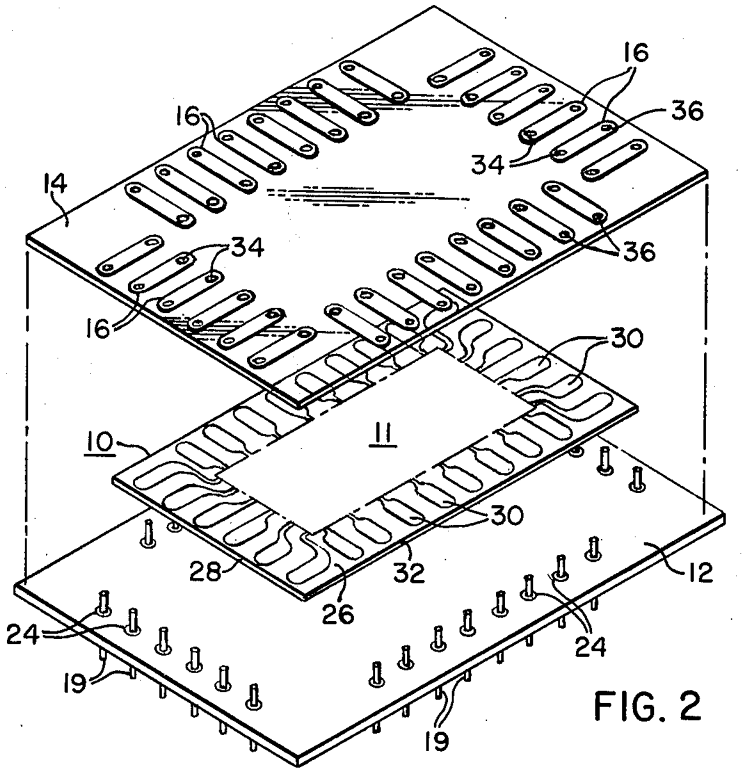
FIG. 2 is an exploded view of parts used to construct the thin-film circuit assembly package shown in FIG. 1; and, FIG. 3 is a sectional view taken along the line III—III of FIG. 1.

FIG. 2 is an exploded view of the major components of the thin-film electrical circuit assembly 10 shown in FIG. 1 as it is packaged with the base 12. The base 12 is constructed of a layer of suitable material which, depending on the application, may be a conducting or an insulating material. In the drawing, the base 12 is a conductive sheet metal material such as aluminum having a thickness appropriate to support the assembly 10. The generally rectangular size of the base 12 is larger than either the circuit 11 or insulating sheet 14. The terminal pins 19 extend through the base 12 around the outer portion thereof and are insulated therefrom by insulating bushings, such as the bushing 24, for making external connections to the thin-film circuit 11. The thin-film electrical circuit 11 consists of an arrangement of insulating, conducting, and semiconducting films disposed on an insulated surface 26 of a conductive substrate 28. The construction of the thin-film circuit 11 does not form a part of this invention except, conventionally, connection points are formed by outer portions of conducting metallic films. These portions are exposed on the outer sides of the thin-film circuit 11 to provide lands 30 defining the general rectangular outline thereof and which facilitate electrical connection to the thin-film circuit 11. Normally, thin-film circuits contain a land for each portion of the circuit which is to be connected to an external lead, circuit, component, etc. The particular electrical or electronic functions of the solid-state elements forming the circuit 11 are not critical insofar as this description of the invention is concerned which is intended to be of general application to thin-film circuits.

The substrate 28 preferably consists of a suitable thickness of aluminum foil which has been passivated, or insulated, by a suitable oxidizing or anodizing process to form the insulated surface 26 thereof. However, the edges of the foil substrate 28, such as the edge 32, are not normally covered by the insulated surface 26. This occurs since the substrate 28 is cut in generally rectangular sections from a large sheet of aluminum foil to separate the one thin-film circuit 11 from other thin-film circuits fabricated on a common sheet of substrate material. When assembled in a circuit package, the substrate 28 may be attached to the base 12 by a suitable adhesive, not shown. When a metallic base 12 is used, the power capability of the thin-film electrical circuit 11 is enhanced due to the heat sink effects of the metallic base 12 by thermally conducting heat from the circuit 11.

The insulating sheet 14 consist of a thin sheet of insulating material such as Mylar or a polyimide such as that known by the trademark "Kapton." The outer sides of the sheet 14 are rectangular to extend over the lands 30 to the outer portion of base 12 including the pins 19. A transparent insulating material is preferred because it aids in the visual alignment of the lead strips 16 of the insulating sheet 14 in the desired location over the thin-film circuit 11. The sheet 14 includes a plurality of the elongated lead strips 16 disposed as illustrated in FIGS. 1 and 2 on the upper surface thereof so as to extend transversely across edges of the substrate 28 between the lands 30 and pins 19. The strips 16 consist of conductive laminate material suitably attached and positioned on the insulating sheet 14. One preferred method for providing the sheet 14 with the lead strips 16 thereon involves the use of a sheet of metal clad conductive material laminated to the sheet 14. Using well known techniques, the metal which is laminated to the insulating sheet 14 is removed from between remaining areas defining the strips 16 by well known etching techniques. The metal remaining on the insulating material of sheet 14 forms the strips 16. It is not necessary to practice this invention that the sheet cover all of the circuit 11 but this does give added protection thereof.

Each of the lead strips 16 and the insulating sheet 14 have an openings 34, shown in FIG. 3 near the inner strip ends and an opening 36 near the outer strip ends. These openings permit electrical connection of the lead strips 16 to the lands of the electrical circuit 11 and to the pins 19. These connections are made with the use of the conductive bonding material 18 which secures the bonded components together mechanically as well as electrically.

FIG. 3 is a partial, cross-sectional view taken along the section line III—III of FIG. 1 taken the elongated center of one of the strips 16. The substrate 28 is located on top of the base 12 and may be attached thereto by an adhesive, not shown, as herebefore described. The thin-films forming the circuit 11, and the lands 30 to which electrical connection must be made, are deposited on the insulated substrate surface. The insulating sheet 14 is positioned over the top of the thin-films 26 with each opening 34 aligned with a predetermined one of the lands 30. The edge 40 of the insulating sheet 14 extends beyond the edge 32 of the substrate 28. The conductive lead strips 16 also extend beyond the edge 32. Since the insulating sheet 14 extends over the edge 32 and lays between the substrate 28 and the lead strip 16, the possibility of electrical shorting contact therebetween is prevented.

The conductive bonding material 18 is placed in a flowable state in the opening 34 after the insulating sheet 14 has been aligned with the substrate 28. The conductive bonding material 18 provides an electrical connection between the lead strip 16 and the lands 30 forming the connection points to the thin-film circuit 11. The conductive bonding material 18 also effectively secures the insulating sheet 14 to the substrate 28 since the lands 30 are adhered thereto. One preferred form of the bonding material 18 is a settable epoxy resin containing a conductive metal powder provides a suitable composition for the conductive characteristic of the material 18. In the uncured state, this bonding material is flowable into the opening 34. It is within the contemplation of this invention that other compositions of conductive bonding material may be used, including various forms of solder which are sometimes not desirable since they must be heated to properly flow and adhere to the parts to be electrically connected and bonded together.

A settable bonding composition forming the conductive bonding material 20 can be the same as the material 18. The material 20 electrically connects and bonds the lead strips 16 to the terminal pins 19 after the upper pin ends are positioned in each opening 36. The lower pin ends may be inserted into corresponding sockets or soldered to leads on a pointed circuit board. It is also within the scope of this invention that other members may be electrically connected to the outer portion of the lead strip 16 by arrangements different from opening 36 and pins 19. For example, wire leads may be placed on top of the lead strip 16 and attached thereto by a suitable conductive bonding material. With such an arrangement, the opening 36 would not be required.

The insulating sheet preferably should have a relatively small thickness on the order of 0.001 to 0.005 inch. By using a thin insulating sheet 14, possible destructive thermal expansion between the lead strip 16 and the insulating sheet 14 and between points of connection on the electrical circuit 11 are minimized.

The arrangement disclosed herein is useful in production line construction of thin-film circuits and may be helpful in making quantity production of thin-film circuits economically feasible. Since numerous changes may be made in the above-described apparatus, and since different embodiments of the invention may be made without departing from the spirit thereof, it is intended that all of the matter contained in the foregoing description, or shown in the accompanying drawing, shall be interpreted as illustrative rather than limiting.

I claim as my invention:

1. A thin-film electrical circuit assembly comprising:

a flat base member;

a plurality of terminals supported at an outer portion of said base member;

a conductive foil substrate supported on said base member inwardly of said terminals, said conductive foil substrate having an insulated surface and uninsulated peripheral edges exposed by separation of the substrate from adjacent areas of conductive foil material having the insulated surface;

a plurality of thin-films deposited on said insulated surface of said substrate so as to form a thin-film electrical circuit, and a plurality of conductive lands extending from the electrical circuit and toward the peripheral edges of the substrate for defining connecting points for making electrical connections to the electrical circuit;

a thin insulating sheet substantially covering said base member and said conductive foil substrate, said insulating sheet having a plurality of conductive lead members on the side thereof away from said base member, said plurality of conductive lead members having predetermined positions overlapping said lands and extending away therefrom to said terminals, said insulating sheet having openings therethrough at one end of said conductive lead members, said openings in the insulating sheet being aligned over said lands with a portion of the insulating sheet and a portion of the conductive lead members thereon extending over the complete extent of the adjacent peripheral edges of the substrate with the outer portion of the insulating sheet engaging said base member;

a conductive bonding material extending through said openings and between said lands and said conductive lead members to provide electrical connections therebetween; and means connecting a second end of said conductive lead members to said terminals.

2. The thin-film electrical circuit assembly of claim 1 wherein the conductive foil substrate comprises aluminum and the insulating sheet comprises a polyimide.

3. The thin-film electrical circuit assembly of claim 1 wherein the insulating sheet comprises a transparent material.

4. The thin-film electrical circuit assembly of claim 1 wherein the openings through the insulating sheet also extend through the conductive lead members thereon.

5. The thin-film electrical circuit component of claim 1 wherein the conductive bonding material comprises an epoxy resin containing conductive metallic particles.

6. The thin-film electrical circuit assembly of claim 1 wherein said terminals include a plurality of pins extending through the base in an insulated relationship thereto, said substrate being attached to said base, and the conductive leads include holes at the second ends thereof with said holes extending through said insulating sheet for receiving and being electrically connected to said pins.

* * * * *